(12) United States Patent
Scheele et al.

(10) Patent No.: US 8,400,233 B2
(45) Date of Patent: Mar. 19, 2013

(54) CIRCUIT FOR IMPEDANCE MATCHING

(75) Inventors: Patrick Scheele, Ulm (DE); Matthias Schmidt, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/950,024

(22) Filed: Nov. 19, 2010

(65) Prior Publication Data

US 2011/0090021 A1 Apr. 21, 2011

Related U.S. Application Data

(63) Continuation of application No. PCT/EP2009/056092, filed on May 19, 2009.

(30) Foreign Application Priority Data

May 21, 2008 (DE) .......................... 10 2008 024 482

(51) Int. Cl.
H03H 7/38 (2006.01)

(52) U.S. Cl. .......................................... 333/32

(58) Field of Classification Search .................. 333/32, 333/33, 28 R
See application file for complete search history.

(56) References Cited

U.S. PATENT DOCUMENTS

| | | | | |
|---|---|---|---|---|
| 3,116,373 A | * | 12/1963 | Dome | ................................ 381/4 |
| 3,474,181 A | | 10/1969 | Ayres | |
| 4,443,772 A | * | 4/1984 | Schwarzmann | ............. 333/28 R |
| 4,763,087 A | | 8/1988 | Schrader | |
| 5,202,651 A | * | 4/1993 | Yoshimasu | .................... 333/170 |
| 6,531,933 B2 | * | 3/2003 | Miyamoto et al. | ............ 333/133 |
| 6,765,540 B2 | | 7/2004 | Toncich | |
| 6,895,225 B1 | | 5/2005 | Talvitie et al. | |
| 7,009,455 B2 | | 3/2006 | Toncich et al. | |
| 7,012,483 B2 | | 3/2006 | York | |
| 7,176,845 B2 | | 2/2007 | Fabrega-Sanchez et al. | |
| 7,202,747 B2 | | 4/2007 | Forse et al. | |
| 7,221,327 B2 | | 5/2007 | Toncich et al. | |
| 2006/0160501 A1 | | 7/2006 | Mendolia et al. | |

FOREIGN PATENT DOCUMENTS

| | | |
|---|---|---|
| EP | 0 685 936 B1 | 9/2003 |
| WO | WO 2006/083432 A1 | 8/2006 |
| WO | WO 2007/103537 A2 | 9/2007 |

OTHER PUBLICATIONS

Kurokawa, K. "Power Waves and the Scattering Matrix," IEEE Transactions on Microwave Theory and Techniques, Mar. 1965, pp. 194-202.

Arell, T., et al., "A Unique 2 to 6 GHz 1 Watt High Efficiency GaAs MMIC Amplifierdesign Using All-Pass Matching Networks," Gallium Arsenide Integrated Circuit Symposium, 14th Annual IEEE, Oct. 4-7, 1992, 5 pages, Miami Beach, FL.

Scheele, P, et al., "Continuously Tunable Impedance Matching Network Using Ferroelectric Varactors," 2005 IEEE MTT-S International, Microwave Symposium Digest, Jun. 12-17, 2005, 5 pages.

* cited by examiner

*Primary Examiner* — Stephen Jones (74) *Attorney, Agent, or Firm* — Slater & Matsil, L.L.P.

(57) ABSTRACT

A circuit provided for impedance matching includes an input, an output and four impedance elements arranged between them. In this case, two of the impedance elements are connected in series in a main path and form a T configuration with a third component. In addition, a fourth component is connected in parallel with the main path of the circuit. By way of example, the components arranged in the main path are variable capacitances and the further components are inductances.

12 Claims, 9 Drawing Sheets

CIRCUIT FOR IMPEDANCE MATCHING

This application is a continuation of co-pending International Application No. PCT/EP2009/056092, filed May 19, 2009, which designated the United States and was not published in English, and which claims priority to German Application No. 10 2008 024 482.1, filed May 21, 2008, both of which applications are incorporated herein by reference.

BACKGROUND

The impedance of an antenna is dependent on the spatial surroundings thereof. This impedance is therefore subject to severe fluctuations, particularly in the case of mobile radios. However, the radiated real power of a mobile radio is heavily dependent on the extent to which the impedance of the antenna matches the impedances of further electric components connected thereto, such as a power amplifier. In addition, the impedance of electric components is also dependent on the frequency of a transmitted signal.

In the mobile radio sector, a plurality of frequency bands is used for signal transmission. To attain a maximum radiated real power, it is necessary to match the impedances in a plurality of frequency bands which are used.

The document U.S. Pat. No. 7,202,747 B2 describes a circuit for impedance matching.

SUMMARY

In one aspect, the present invention specifies a circuit that can be used to match the impedance of a generator as flexibly as possible to the impedance of a load.

Embodiments of the invention specify a circuit for impedance matching. The circuit has an input, which can be connected to a generator, for example, and an output, which can be connected to a load, for example. In a mobile radio, this may correspond to a power amplifier as a generator and to an antenna as a load. However, the antenna can also be used as a generator and the load can correspond to the input of a receiver.

The circuit has a plurality of components that can each be described by an effective impedance. In this case, each of the components may be made up of one or more electric units. The interaction of the impedances of the electric units results in an effective impedance for the component. Such a component is subsequently also called an impedance element.

A main path between the input and the output of the circuit contains two impedance elements connected in series with one another. A third impedance element is connected thereto such that a T configuration is obtained. In addition, the circuit comprises a further impedance element which is connected in parallel with the main path of the circuit.

This configuration allows a flexible layout for a circuit for impedance matching and optimization and, in particular, expansion of the usable frequency range.

Preferably, each of the impedance elements is chosen independently of the other impedance elements from the set of inductances, capacitances and lines or is made up of a plurality of such electric units.

In one preferred embodiment, the impedance elements arranged in the main path are embodied as capacitances and the third and further impedance elements are embodied as inductances.

Preferably, at least one impedance element is adjustable. By way of example, at least one of the capacitances can have the capacitance value adjusted, In this case, adjustability is intended to mean at least two different capacitance values between which it is possible to select and switch to and from during operation of the circuit. Advantageously, the adjustability covers a multiplicity of possible capacitance values. In one embodiment, the capacitance values of both capacitances are variable steplessly in a particular adjustment range.

Variable capacitances of this kind can be used to match the impedance of a load flexibly to the impedance of a generator. By way of example, it is thus possible to optimize the real power within the largest possible tuning range for the load impedances. In particular, it is possible for alteration of the impedance of the load or of the generator to involve attainment of tuning for the impedances without needing to connect or disconnect individual circuit elements. In this case, a particularly inexpensive and space-saving circuit for impedance matching may result.

The tuning range for the circuit can be optimized by means of suitable selection of the capacitances and of the inductances. In particular, it is determined by the magnitude of the adjustment ranges for the capacitances and by the fineness of the stepping between the adjustable capacitance values. A variable capacitance may be in the form of a switched capacitor in which the capacitance values can be adjusted, for example, using binary stepping, between a maximum value and a minimum value. An example of a switched capacitance is a MEMS capacitance. In a further embodiment, a capacitance is used in which the capacitance value can be varied steplessly within an adjustment range. By way of example, this is possible in the case of a varactor based on semiconductors or ferroelectrics, which can be used in a circuit as a steplessly variable capacitance.

In one embodiment, the two capacitances of the main path have identical adjustment ranges. The use of identical units reduces the complexity of the circuit and the costs of production.

Alternatively, the capacitances may have different adjustment ranges.

In one preferred embodiment, the capacitances and the inductances are chosen such that the impedances can be matched within a plurality of frequency bands simultaneously. This is advantageous particularly in the case of mobile radios, in which a plurality of frequency bands are used.

In addition, a circuit arrangement is specified which comprises a plurality of circuits for impedance matching.

In one embodiment, the circuit arrangement has at least two circuits for impedance matching which are connected in series with one another.

This is advantageous particularly if the impedance needs to be matched within a plurality of, e.g., two frequency bands. In the case of two frequency bands, the circuit arrangement comprises two circuits for impedance matching, for example, which are connected in series with one another. In this context, a first circuit is dimensioned such that it can be used for matching the impedance in the first frequency band. One suitable instance of circuit dimensioning involves the circuit prompting no significant change in the impedances for a second frequency band. This circuit is therefore a passage element for the second frequency band. A suitably dimensioned second circuit can be used to attain matching impedance in the second frequency band. This further circuit is designed such that it has no significant effect on the impedance matching in the first frequency band and is therefore a passage element for the first frequency band.

In a further embodiment, the circuit arrangement has at least two circuits for impedance matching which are connected in parallel with one another.

Such a circuit arrangement can likewise be used for the simultaneous matching of the impedance in two frequency ranges. By way of example, the impedance elements of the first circuit are chosen such that it can be used for matching the impedance in a first frequency band but is a band rejection filter for the second frequency band. To this end, the input and output impedances of the circuit are chosen such that their real parts are very much larger than the real parts of the generator and load impedances. A second circuit connected in parallel therewith is dimensioned such that it is a band rejection filter for the first frequency band and can be used for impedance matching for the second frequency band.

Such a circuit arrangement can therefore be used to attain simultaneous impedance matching within a plurality of frequency bands.

BRIEF DESCRIPTION OF THE DRAWINGS

The text below explains the specified circuits for impedance matching and the advantageous embodiments thereof with reference to schematic figures, which are not to scale, in which.

The following list of reference symbols may be used in conjunction with the drawings:

A Circuit for impedance matching
IN Input
OUT Output
Z1, Z2, Z3, Z4 Impedance elements
L1, L2 Inductances
C1, C2 Capacitances
G Generator
L Load
$Z_G$ Generator impedance
$Z_L$ Load impedance
$Z_{IN}$ Input impedance
$Z_{OUT}$ Output impedance
$R_{IN}$ Input reflection factor
$R_{OUT}$ Output reflection factor
VSWR Voltage Standing Wave Ratio

DETAILED DESCRIPTION OF ILLUSTRATIVE EMBODIMENTS

Figure 1:
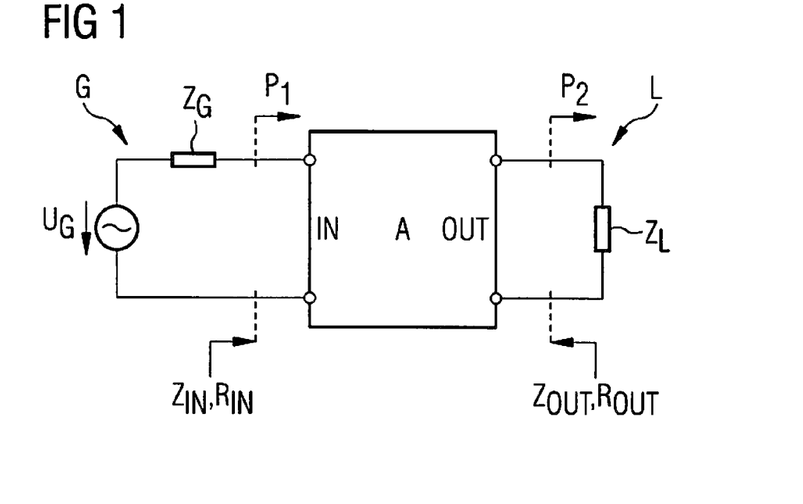
FIG. 1 schematically shows the arrangement of a circuit for impedance matching between a generator and a load.

FIG. 1 schematically shows a generator G which is connected to a load L via a circuit for impedance matching A. The circuit for impedance matching A is also called a matching network. In a mobile radio, the generator G corresponds to the output of a power amplifier and the load L corresponds to an antenna, for example. The generator G delivers an AC voltage $u_G$ and can be described by the complex generator impedance $Z_G$. The load L is described by its complex load impedance $Z_L$. The generator outputs a first real power $P_1$ to the matching network via the input IN. The matching network outputs a second real power $P_2$ to load L via the output OUT. The circuit for impedance matching is intended to be used to maximize the real power $P_2$ which is output to the load and hence to minimize the reflected power.

The reflected power can be described by an input reflection factor $R_{IN}$ and an output reflection factor $R_{OUT}$. On the generator side, there is a whole circuit with the input impedance $Z_{IN}$ and a normalized input reflection factor $R_{IN}$. In this case, the input reflection factor $R_{IN}$ is normalized to the generator impedance $Z_G$. On the load side, there is accordingly an output impedance $Z_{OUT}$ and a whole circuit with an output reflection factor $R_{OUT}$. In this case, the output reflection factor $R_{OUT}$ is usually based on the output impedance $Z_{OUT}$. The reflection factor $R_{IN}$ is defined as $R_{IN}=(Z_{IN}-Z_G^*)/(Z_{IN}+Z_G)$. Similarly, the output reflection factor is defined as $R_{OUT}=(Z_{OUT}-Z_L^*)/(Z_{OUT}+Z_L)$.

In the case of an ideal, lossless matching network A, the conditions to be satisfied simultaneously for reflectionless matching of the input and output are $Z_{IN}(A, Z_L)=Z_G^*$ and $Z_{OUT}(A, Z_G)=Z_L^*$. In this case, the generator G outputs its maximum possible real power $P_1$ to the matching network, which in turn output the maximum possible real power $P_2$ to the load. An ideal, lossless matching network of this kind is technical infeasible, however.

In the case of a not completely lossless matching network, only one of the two conditions can be satisfied. This means that either reflectionless matching of the impedance between the generator and the input of the matching network or reflectionless matching between the output of the matching network and the load is feasible.

To ascertain the tuning range for a matching network A, it is possible to require reflectionless matching at the input of the matching network, for example. For the purpose of calculation, it is assumed that the generator impedance $Z_G$ and hence also the input impedance $Z_{IN}$ are constant. These can be used to ascertain those load impedances for which reflectionless matching between the generator and the matching network is fulfilled, i.e. for which $R_{IN}=0$ is true. These load impedances are subsequently also called optimum load impedances $Z_{L,\,OPT}$.

Alternatively, reflectionless matching at the output of the matching network can be required. In this case, it is assumed for the calculation of the tuning range that the load impedance $Z_L$ and hence the output impedance $Z_{OUT}$ are constant. These can be used to ascertain optimum generator impedances, which result in reflectionless matching between the output of the matching network and the load, i.e., in $R_{OUT}=0$.

Figure 2:
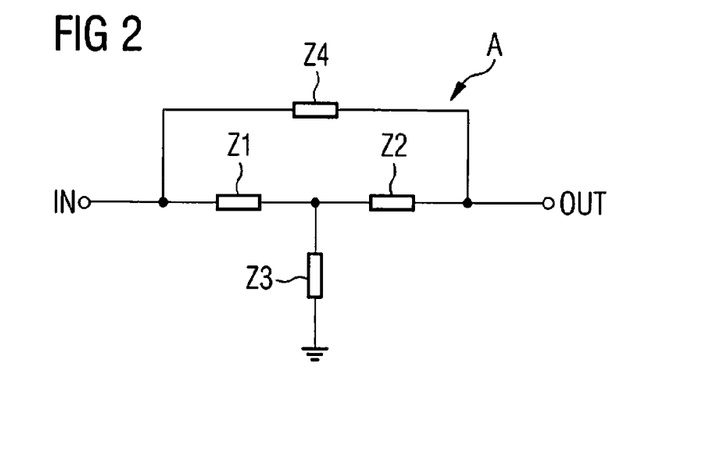
FIG. 2 shows a circuit for impedance matching with four impedance elements.

FIG. 2 shows a circuit for impedance matching A, in which an input IN and an output OUT have two impedance elements Z1 and Z2 connected in series between them in a main path. These impedance elements form a T configuration together with a third impedance element Z3. A fourth impedance element Z4 is connected in parallel with the main path between the input IN and the output OUT.

By way of example, the impedance elements Z1, Z2, Z3, Z4 are capacitances, inductances or lines. Each impedance element may also be made up of a plurality of such elements which can be described by an effective total impedance.

Figure 3:
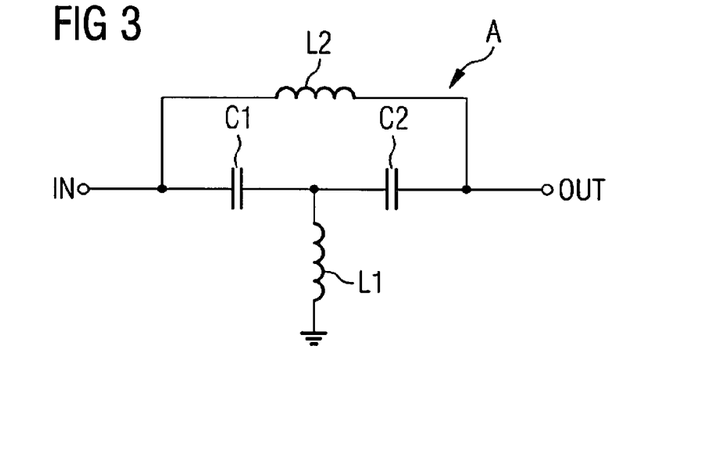
FIG. 3 shows a circuit for impedance matching with two capacitances and two inductances.

FIG. 3 shows a circuit for impedance matching A in which the impedance elements Z1, Z2 connected in series in the main path are embodied as capacitances C1, C2. The third and further impedance elements are inductances L1 and L2.

In one advantageous embodiment, the capacitances C1 and C2 are elements with adjustable capacitance values. The use of variable impedance elements allows the properties of the matching network A and particularly the tuning range thereof to be altered.

By way of example, the input of the matching network A has a generator with a generator impedance $Z_G=50\Omega$ applied to it. Complex generator impedances are also possible. The output has a load with a load impedance $Z_L$ applied to it, for example. The tuning range of such a matching network A is obtained, by way of example, from the requirement of reflectionless matching at the input, i.e., the following shall apply: $Z_{IN}^*=Z_G=50\Omega$ and $R_{IN}=0$.

FIGS. 4A, 4B, 6A, 6B, 7A, 7B and 8A-8G have optimum load impedances $Z_{L,\,OPT}$, at which reflectionless matching appears at the input, plotted for differently dimensioned matching networks as shown in FIG. 3. For comparison therewith, FIGS. 5A and 5B have optimum load impedances $Z_{L,\,OPT}$ plotted which arise for a circuit which only comprises a T configuration without a further parallel impedance element.

In FIGS. 4A to 8G, the optimum load impedances $Z_{L,\,OPT}$ are respectively plotted in a Smith diagram and in a Cartesian coordinate system. From the presentation of an optimum load impedance $Z_{L,\,OPT}$ in the Smith diagram, it is possible to ascertain the associated reflection factor and the standing wave ratio VSWR (Voltage Standing Wave Ratio). In this case, the optimum load impedances $Z_{L,\,OPT}$ are respectively normalized to a reference impedance of 50Ω, which may correspond to the generator impedance $Z_G$, for example. In a Cartesian coordinate system, the imaginary part $I(Z_{L,\,OPT})$ of an optimum load impedance $Z_{L,\,OPT}$ is plotted against the real part $R(Z_{L,\,OPT})$ thereof.

Figure 4A:
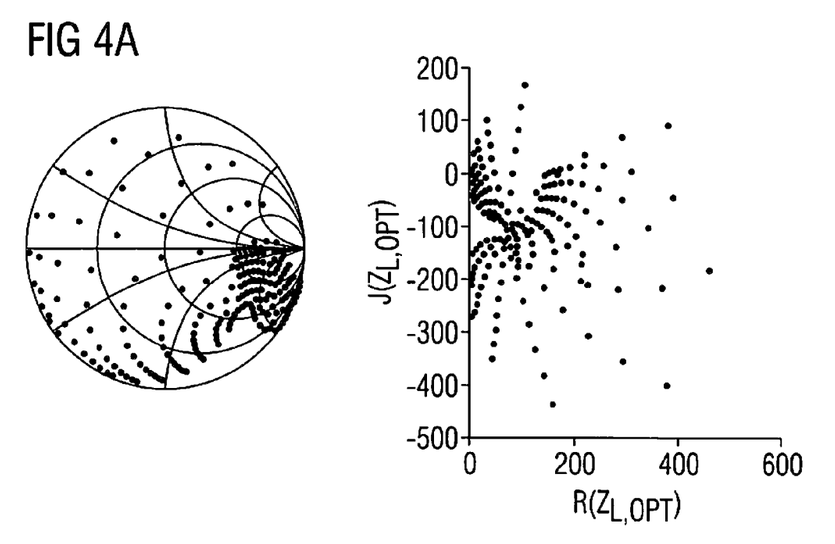
FIG. 4A uses a Smith diagram and a Cartesian coordinate system to show the optimum load impedances for a circuit for impedance matching as shown in FIG. 3 for a first frequency.
Figure 4B:
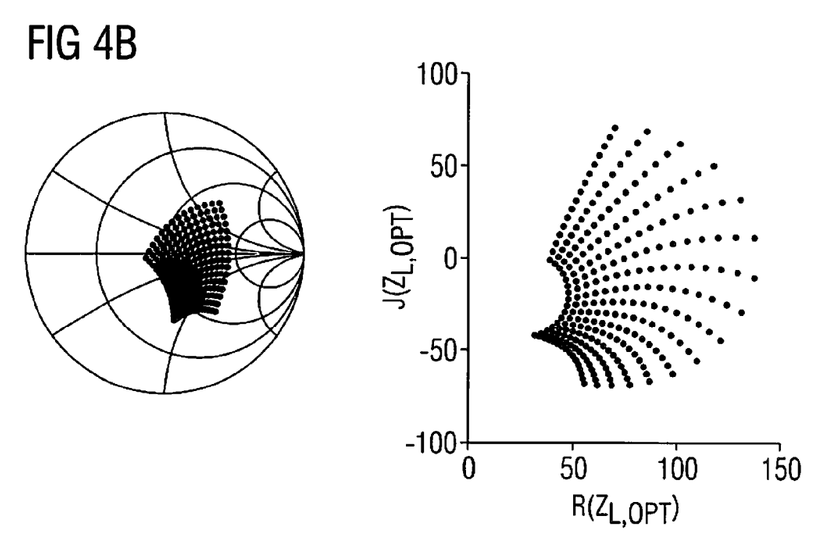
FIG. 4B uses a Smith diagram and a Cartesian coordinate system to show the optimum load impedances for a circuit for impedance matching as shown in FIG. 3 for a second frequency.

FIGS. 4A and 4B are based on a circuit for impedance matching as shown in FIG. 3, wherein the capacitances C1 and C2 have an adjustment range of between 0.125 pF and 2 pF. The capacitance values have each been adjusted in sixteen steps in this range. The inductance L1 has an inductance value of 4.9 nH and the inductance L2 has an inductance value of 12.3 nH.

Optimum load impedances $Z_{L,\,OPT}$ have been ascertained for two frequency bands of the mobile radio range. The calculations have respectively been based on the center frequency of the uplink range.

In FIG. 4A, optimum load impedances $Z_{L,\,OPT}$ have been ascertained for UMTS band I, in which the center frequency is 1950 MHz. In this case, a broad distribution for the optimum load impedances and hence a large matchable impedance range are obtained.

In FIG. 4B, optimum load impedances $Z_{L,\,OPT}$ have been ascertained for the GSM 900 frequency band, in which the center frequency is 897.5 MHz. The ratio of the center frequencies of the UMTS-band and of the GSM 900 band is 2.17. As shown by FIG. 4B, impedances around 50Ω are easily matched in the GSM 900 band. The matching network can also be used as a passage element for this frequency band without impedance matching.

Figure 5A:
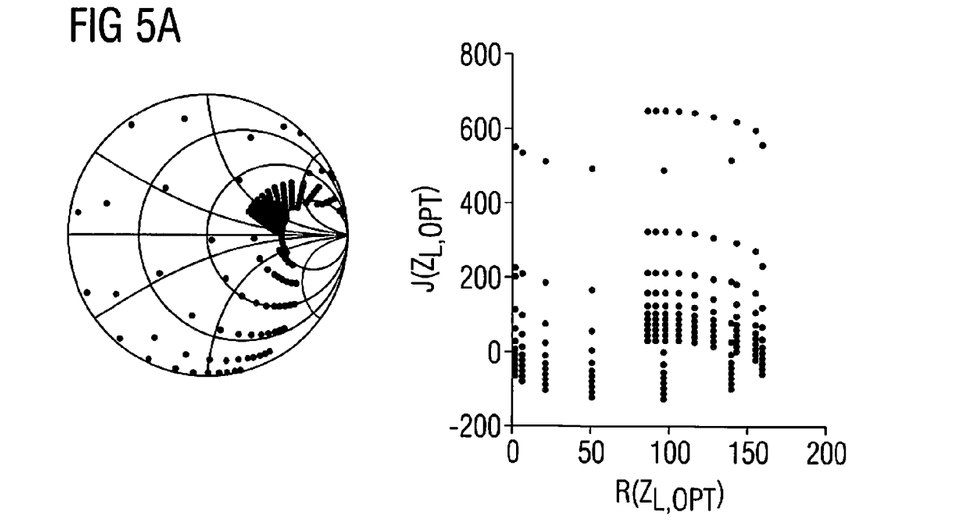
FIGS. 5A and 5B use a Smith diagram and a Cartesian coordinate system to show the optimum load impedances for a circuit comprising a T configuration for the frequencies shown in FIGS. 4A and 4B.
Figure 5B:
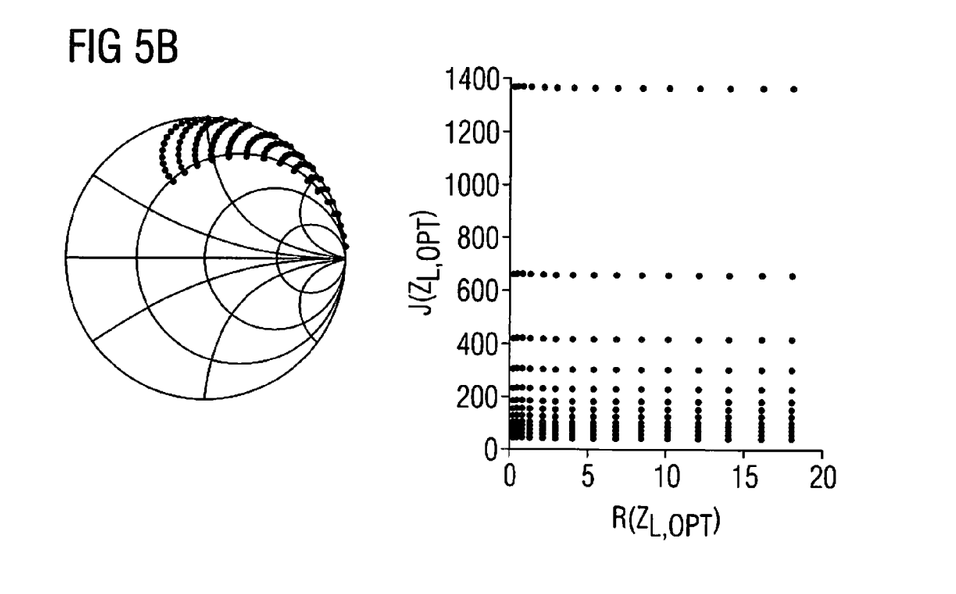

FIGS. 5A and 5B have the optimum load impedances $Z_{L,\,OPT}$ plotted which are obtained for a circuit with a T configuration, i.e., without the inductance L2. In this case, the capacitances C1 and C2 are designed like the capacitances shown in FIGS. 4A and 4B and are varied in the same range. The inductance L1 has an inductance value of 7.35 nH.

In FIG. 5A, the optimum load impedances $Z_{L,\,OPT}$ are again plotted for the center frequency of UMTS band I. As can be seen from the presentation in the Cartesian coordinate system, the present choice of inductance L1 allows a large tuning range to be attained in this case too.

FIG. 5B has the optimum load impedances plotted for the center frequency of the GMS 900 band. In this case, generator impedances around 50Ω can no longer be matched in reflectionless fashion. Therefore, this matching network cannot be used as a passage element in this frequency range.

Figure 6A:
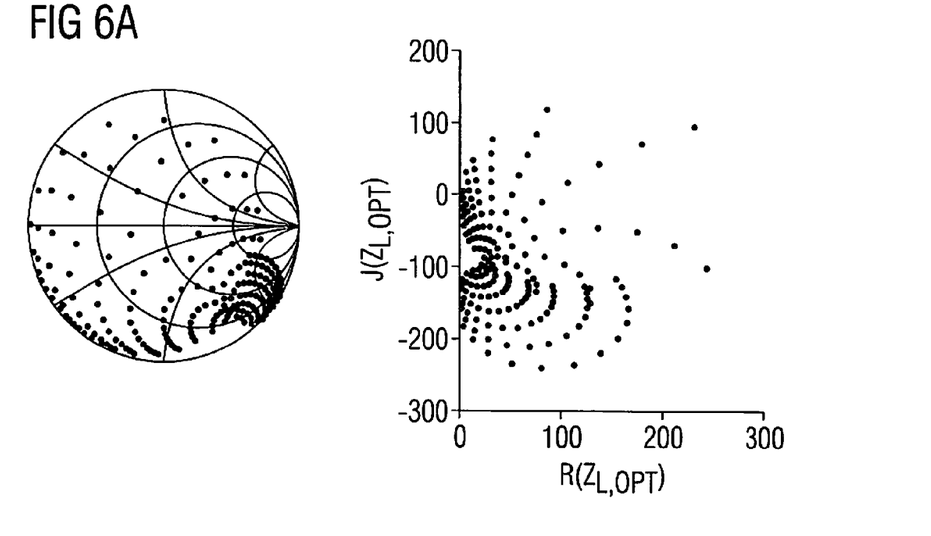
FIGS. 6A and 6B use a Smith diagram and a Cartesian coordinate system to show the optimum load impedances for a further circuit for impedance matching as shown in FIG. 3 for two frequencies.
Figure 6B:
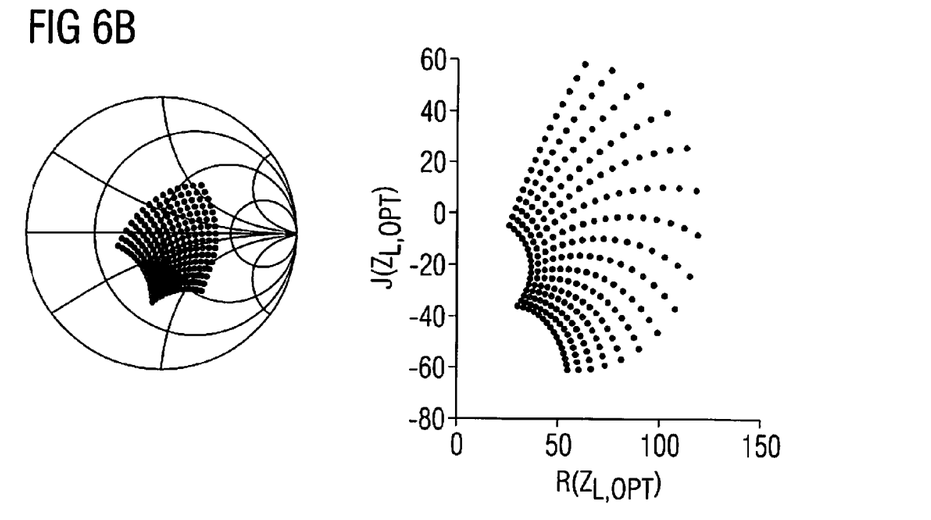

FIGS. 6A and 6B have optimum load impedances plotted for the frequency bands GSM 900 and GSM 1800. The capacitances C1 and C2 and the inductances L1 and L2 are chosen such that the largest possible tuning range is obtained in both frequency bands. The capacitances C1 and C2 have been adjusted in sixteen steps between 0.125 pF and 2 pF. The inductance L1 has an inductance value of 5.5 nH and the inductance L2 has an inductance value of 10.9 nH.

The center frequency in the uplink range is 1747.5 MHz for the GSM 1800 band and 897.5 MHz for the GSM 900 band. This gives a ratio for the center frequencies of 1.95.

FIG. 6A has the optimum load impedances $Z_{L,\,OPT}$ plotted for the GSM 1800 band. As can be seen from the presentation in the Cartesian coordinate system, a large matchable impedance range is obtained.

FIG. 6B has the optimum load impedances $Z_{L,\,OPT}$ plotted for the center frequency of the GSM 900 band. With this circuit dimensioning, generator impedances around 50Ω are easily matched. Alternatively, this matching network can be used as a passage element in the 897.5 MHZ range without impedance transformation.

The subsequent Smith diagrams show circles with a constant VSWR. In each case, the VSWR=2, VSWR=4 and VSWR=8 circles are shown. These circles have also been transferred to the Cartesian coordinate system.

Figure 7A:
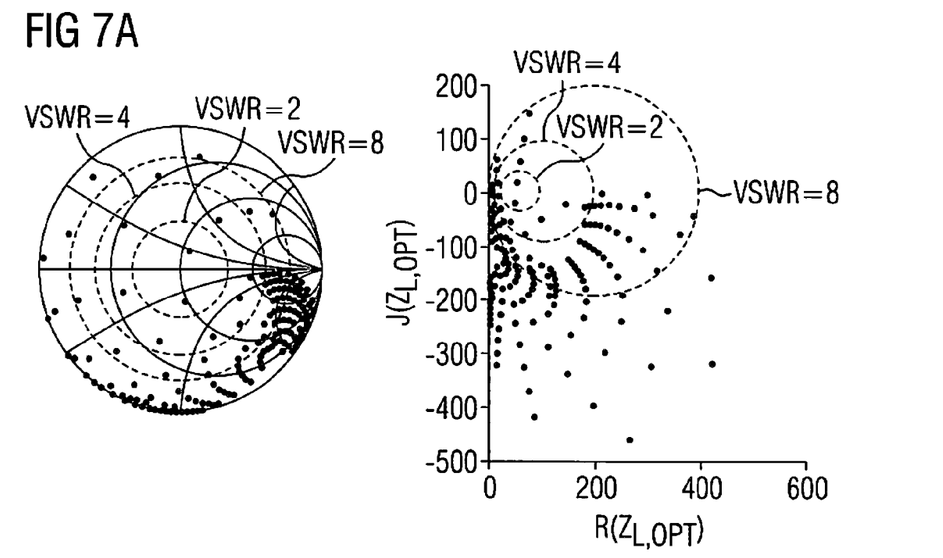
FIGS. 7A and 7B use a Smith diagram and a Cartesian coordinate system to show the optimum load impedances for a further circuit for impedance matching as shown in FIG. 3 for two frequencies.
Figure 7B:
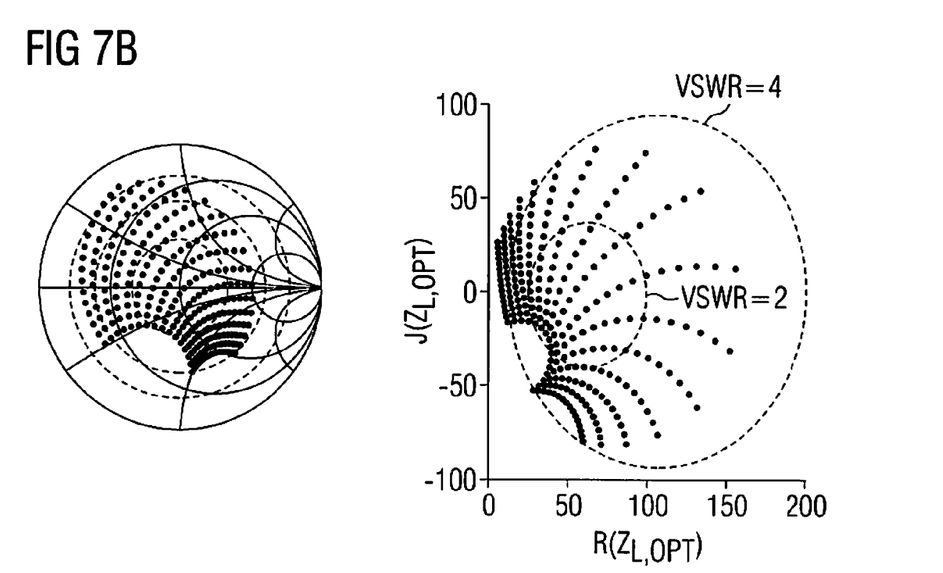

FIGS. 7A and 7B have optimum load impedances $Z_{L,\,OPT}$ plotted for the frequency bands GSM 900 and GSM 1800. in this case, the basis is a circuit for impedance matching as shown in FIG. 3, wherein the capacitances C1 and C2 have different adjustment ranges. The capacitance C1 can be adjusted in the range from 0.176 pF to 2.82 pF and the capacitance C2 can be adjusted in the range from 0.125 pF to 2 pF. Both capacitances can be varied in sixteen steps. The inductance L1 has a value of 6.8 nH and the inductance L2 has a value of 13.7 nH.

FIG. 7A has the load impedances plotted for the center frequency of the GSM 1800 band, which is 1747.5 MHz. It can be seen that in this case no reflectionless matching to 50Ω is possible. The reason for this is that the capacitances can only be switched in steps. However, there are two optimum load impedances within the VSWR=2 circle, which results in matching with a reflection factor <−10 dB. Within the VSWR=8 circle, a large tuning range is obtained, however. The use of capacitances with finer stepping of the adjustable capacitance values allows the tuning range to be improved further.

FIG. 7B has the optimum load impedances plotted for the center frequency of the GSM 900 band. It is clear from the presentation in the Cartesian coordinate system that the matchable impedance range of this circuit is significantly increased in comparison with the circuit on which FIG. 6B is based. In particular, the impedances are largely covered in the VSWR=4 circle.

FIGS. 8A to 8G show the broadband properties of this matching network.

Figure 8A:
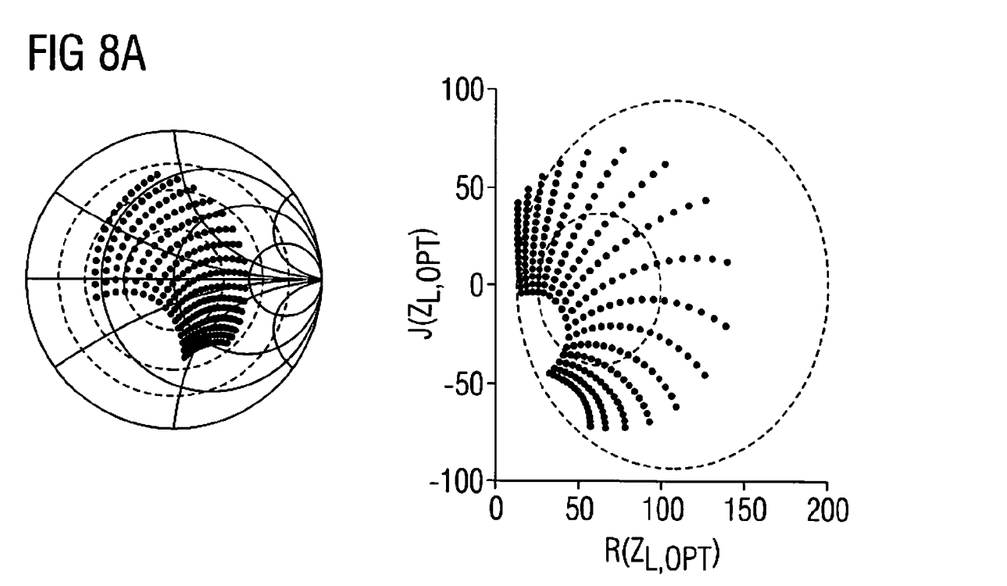
FIGS. 8A to 8G show the optimum load impedances for a circuit for impedance matching as shown in FIG. 3 for various frequencies.

FIG. 8A has optimum load impedances plotted for a frequency of 824 MHz. This corresponds to the lower frequency limit of the GSM 850 uplink band and to the lowest operating frequency of UMTS bands I to X.

Figure 8B:
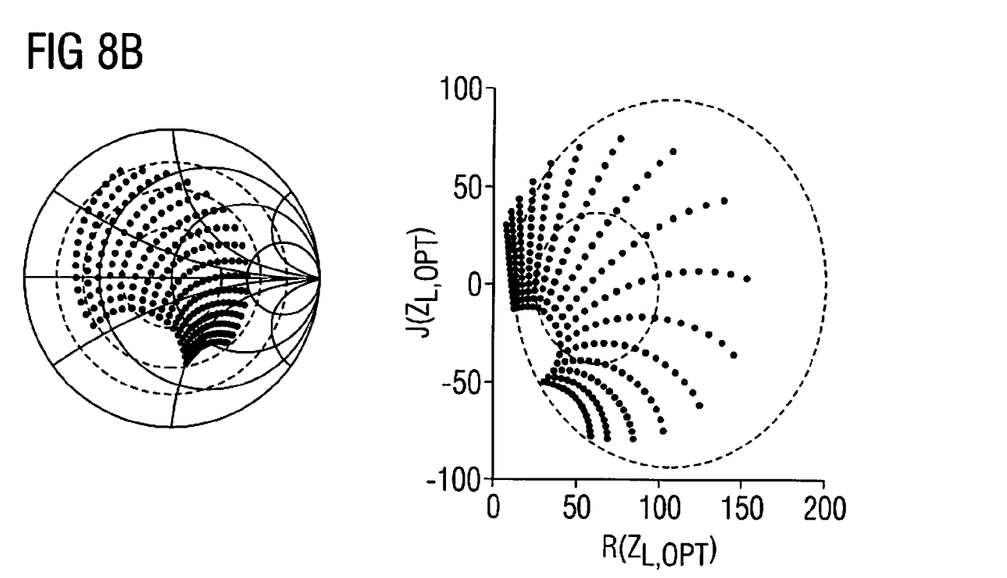

FIG. 8B has optimum load impedances plotted for a frequency of 880 MHz. This frequency is the lower frequency limit of the GSM 900 uplink band.

Figure 8C:
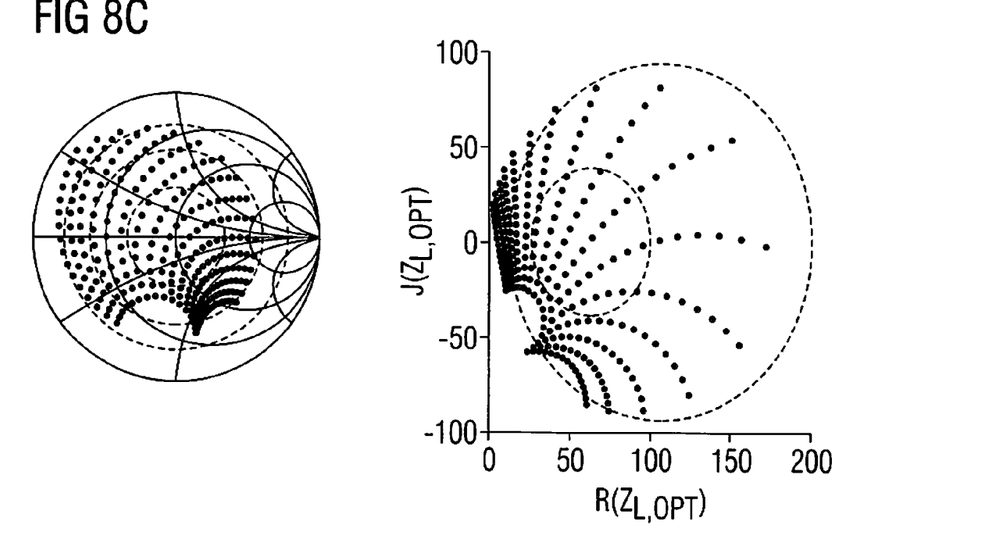

FIG. 8C has optimum load impedances plotted for a frequency of 960 MHz. This corresponds to the upper frequency limit of the GSM 900 downlink band.

As can be seen from FIGS. 8A to 8C, the matching network can be used in the whole frequency range from 824 to 960 MHz for impedance transformation to a generator impedance of 50Ω. Similarly, this matching network can also be used as a passage element in this case. If the generator impedances differ from 50Ω, an optimum tuning range can be attained by virtue of another choice of capacitances C1 and C2 and of inductances L1 and L2.

Figure 8D:
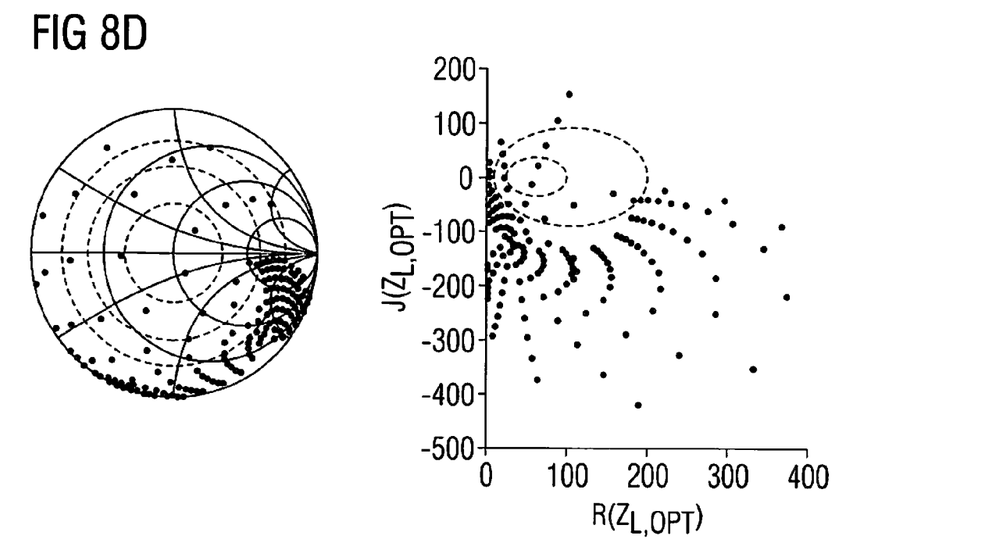

FIG. 8D has optimum load impedances plotted for a frequency of 1710 MHz. This corresponds to a lower frequency limit of the GSM 1800 uplink band.

Figure 8E:
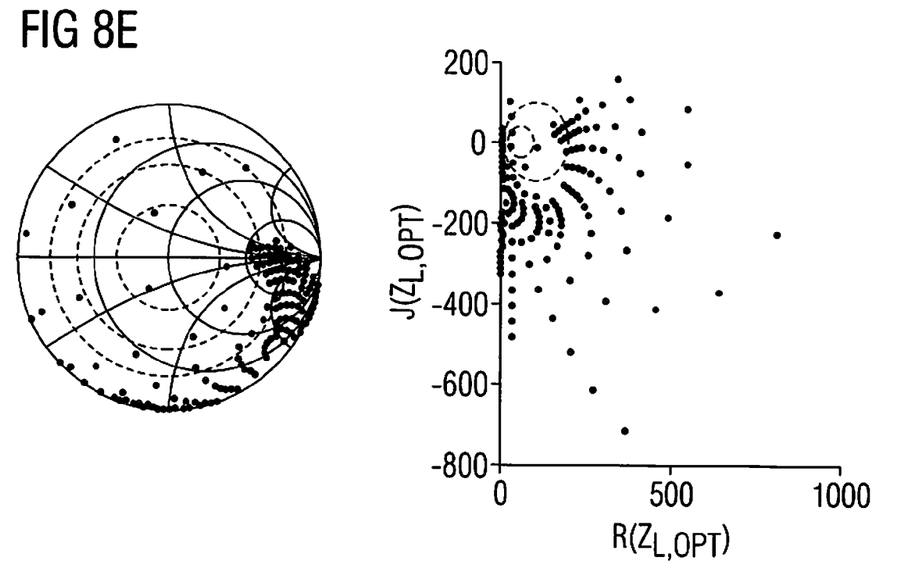

FIG. 8E has optimum load impedances plotted for a frequency of 1880 MHz. This corresponds to the upper frequency limit of the GSM 1800 downlink band and is at the same time the center frequency of the GSM 1900 uplink band.

Figure 8F:
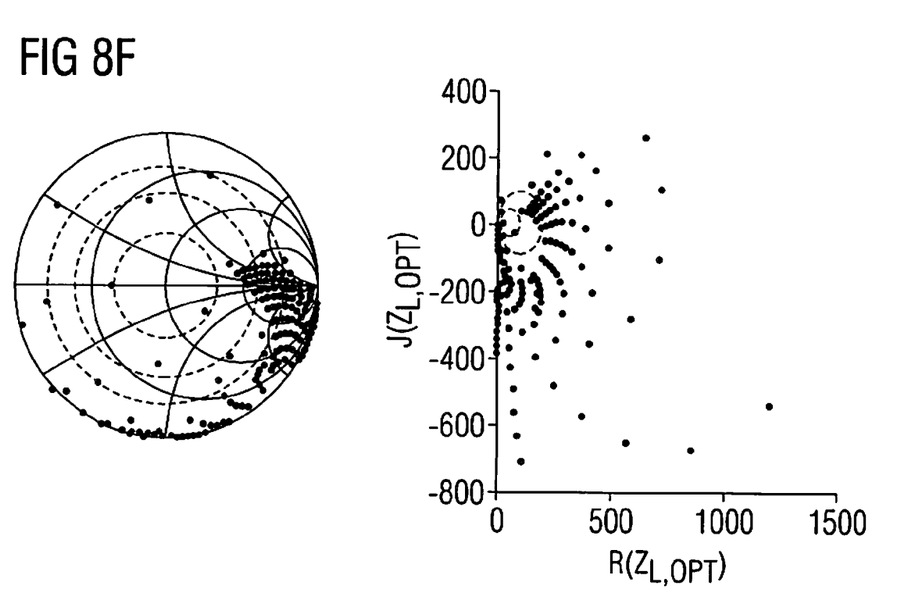

FIG. 8F has optimum load impedances plotted for a frequency of 1980 MHz. This corresponds to the upper frequency limit of the UMTS I uplink band and is 10 MHz below the upper frequency limit of the GSM 1900 downlink band.

Figure 8G:
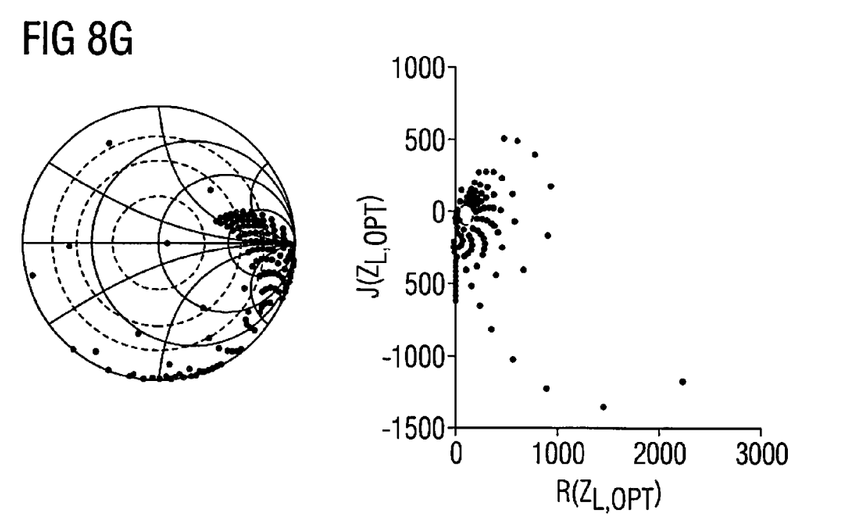

FIG. 8G has optimum load impedances plotted for a frequency of 2170 MHz. This corresponds to the upper frequency limit of the UMTS I downlink band and is at the same time the highest operating frequency of UMTS bands I to VI and VIII to X.

As can be seen from FIGS. 8D to 8G, there is always the assurance that a load impedance of 50Ω with a reflection factor <−10 dB can be matched to a generator impedance of 50Ω. In addition, a large tuning range is obtained within the VSWR=8 circle. There are few optimum load impedances in the region of the VSWR=2 and VSWR=4 circles. Towards relatively large frequency values, the number of optimum load impedances in this range decreases. However, it is possible to compensate for this by selecting capacitances with finer stepping of the capacitance values.

In one preferred embodiment, variable capacitances are used which can be altered continuously in an adjustment range. By way of example, these are ferroelectric varactors or semiconductor varactors.

The invention is not limited to the exemplary embodiments by virtue of the description thereof but rather comprises any new feature and any combination of features. This includes particularly any combination of features in the patent claims, even if this feature or this combination is itself not explicitly specified in the patent claims or exemplary embodiments.

What is claimed is:

1. A circuit arrangement for impedance matching, the circuit arrangement comprising:
an input;
an output;
a first circuit that includes first, second, third and fourth components that each have an effective impedance, wherein the first and second components are coupled in series in a first main path between the input and the output and form a T configuration with the third component, and the fourth component is coupled in parallel with the first main path, wherein the first circuit is suitable for impedance matching in a first frequency band and is a passage element for a second frequency band; and
at least a second circuit coupled to the first circuit and including fifth, sixth, seventh and eighth components that each have an effective impedance, wherein the fifth and sixth components are coupled in series in a second main path between the input and the output and form a T configuration with the seventh component, and the eighth component coupled is coupled in parallel with the second main path, wherein the second circuit is suitable for impedance matching in the second frequency band and is a passage element for the first frequency band.

2. The circuit arrangement for impedance matching as claimed in claim 1, wherein the first and second circuits are connected in series.

3. The circuit arrangement according to claim 2, wherein the first and the second component both comprise an element with an adjustable capacitance value and wherein the capacitances have identical adjustment ranges for their capacitance value.

4. The circuit arrangement for impedance matching as claimed in claim 1, wherein the first and second circuits for impedance matching are connected in parallel.

5. The circuit arrangement for impedance matching as claimed in claim 4,
wherein the first circuit is suitable for impedance matching in a first frequency band and is a band rejection filter for a second frequency band, and
wherein the second circuit is suitable for impedance matching in the second frequency band and is a band rejection filter for the first frequency band.

6. The circuit arrangement according to claim 4, wherein the first and the second component both comprise an element with an adjustable capacitance value and wherein the capacitances have identical adjustment ranges for their capacitance value.

7. An electric component comprising:
an input;
an output;
a first circuit including:
a first component that has an effective impedance;
a second component that has an effective impedance, wherein the first and second components are coupled in series in a main path between the input and the output;
a third component that has an effective impedance, wherein first and second components form a T configuration with the third component; and
a fourth component that has an effective impedance, the fourth component coupled in parallel with the main path, wherein the first circuit is suitable for impedance matching in a first frequency band and is a passage element for a second frequency band;
a second circuit including:
a fifth component that has an effective impedance;
a sixth component that has an effective impedance, wherein the fifth and sixth components are coupled in series in a second main path between the input and the output;
a seventh component that has an effective impedance, wherein fifth and sixth components form a T configuration with the seventh component; and an eighth component that has an effective impedance, the eighth component coupled in parallel with the second main path, wherein the second circuit is suitable for impedance matching in the second frequency band and is a passage element for the first frequency band;

a generator coupled to the input; and a load coupled to the output.

8. The electric component as claimed in claim 7, wherein at least one of the first component and/or the second component is a capacitance with an adjustable capacitance value, and wherein capacitance values of the first and second components are chosen such that in the first frequency band an input impedance of the first circuit and the load matches an impedance of the generator.

9. The electric component as claimed in claim 7, wherein in the first frequency band an output reflection factor ($R_{OUT}$) is less than −10 dB.

10. The electric component as claimed in claim 7, wherein capacitance values of the first and second components are chosen such that in two frequency bands an input impedance matches an impedance of the generator.

11. The electric component as claimed in claim 7, wherein the electric component is part of a mobile radio and wherein the generator comprises an output of a power amplifier and the load comprises an antenna.

12. The electric component as claimed in claim 7, wherein the electric component is part of a mobile radio and wherein the generator comprises an antenna and the load comprises an input of a receiver.

* * * * *